United States Patent
Hiblot et al.

(10) Patent No.: US 11,757,039 B2
(45) Date of Patent: Sep. 12, 2023

(54) METHOD FOR INDUCING STRESS IN SEMICONDUCTOR DEVICES

(71) Applicant: IMEC VZW, Leuven (BE)

(72) Inventors: Gaspard Hiblot, Leuven (BE); Geert Van der Plas, Leuven (BE)

(73) Assignee: IMEC VZW, Leuven (BE)

( * ) Notice: Subject to any disclaimer, the term of this patent is extended or adjusted under 35 U.S.C. 154(b) by 162 days.

(21) Appl. No.: 17/348,267

(22) Filed: Jun. 15, 2021

(65) Prior Publication Data

US 2021/0408287 A1  Dec. 30, 2021

(30) Foreign Application Priority Data

Jun. 24, 2020 (EP) ..................................... 20181930

(51) Int. Cl.
*H01L 29/78* (2006.01)
*H01L 21/8238* (2006.01)
(Continued)

(52) U.S. Cl.
CPC .. *H01L 29/7849* (2013.01); *H01L 21/823807* (2013.01); *H01L 21/823871* (2013.01); *H01L 23/481* (2013.01); *H01L 27/0924* (2013.01)

(58) Field of Classification Search
CPC ......... H01L 29/7849; H01L 21/823807; H01L 21/823871; H01L 23/481; H01L 27/0924;
(Continued)

(56) References Cited

U.S. PATENT DOCUMENTS 6,906,400 B2   6/2005  Delhougne et al.
9,634,143 B1*  4/2017  Wahl ................... H01L 29/7848
(Continued)

FOREIGN PATENT DOCUMENTS

EP   3035369 A1   6/2016
EP   3324436 A1   5/2018
(Continued)

OTHER PUBLICATIONS

Extended European Search Report and Written Opinion, Application No. EP20181930.7, dated Mar. 9, 2021, 5 pages.
(Continued)

*Primary Examiner* — Karen Kusumakar
*Assistant Examiner* — Adam S Bowen
(74) *Attorney, Agent, or Firm* — McDonnell Boehnen Hulbert & Berghoff LLP (57) ABSTRACT

Example embodiments relate to methods for inducing stress in semiconductor devices. One method includes a method for producing a first semiconductor device and a second semiconductor device configured to conduct current through the controlled density of charge carriers in a channel area. The charge carriers of the first semiconductor device have opposite polarity to the charge carriers of the second semiconductor device. The method includes producing a stress relaxed buffer (SRD) layer. The back side of the SRB layer is positioned on a substrate. The method also includes producing a semiconductor layer on the front side of the SRB layer. Additionally, the method includes producing the first semiconductor device and the second semiconductor device on the semiconductor layer, removing the substrate, thinning the SRB layer, producing a cavity in the SRB layer, and filling the cavity with a material to create a stress compensation area.

20 Claims, 5 Drawing Sheets

(51) Int. Cl.
*H01L 23/48* (2006.01)
*H01L 27/092* (2006.01)

(58) Field of Classification Search
CPC ......... H01L 21/823821; H01L 23/5286; H01L 23/535; H01L 21/76898
See application file for complete search history.

(56) References Cited

U.S. PATENT DOCUMENTS

| | | | |
|---|---|---|---|
| 9,799,675 | B2 | 10/2017 | Bedell et al. |
| 2004/0150013 | A1 | 8/2004 | Ipposhi |
| 2011/0233785 | A1 | 9/2011 | Koester et al. |
| 2011/0254092 | A1 | 10/2011 | Yang et al. |
| 2017/0092547 | A1* | 3/2017 | Tang ..................... H01L 29/16 |
| 2020/0176448 | A1 | 6/2020 | Huang et al. |

FOREIGN PATENT DOCUMENTS

| | | |
|---|---|---|
| WO | 2007050754 A2 | 5/2007 |
| WO | 2007050754 A3 | 6/2007 |

OTHER PUBLICATIONS

Eneman, Geert, D. P. Brunco, Liesbeth Witters, Benjamin Vincent, Paola Favia, Andriy Hikavyy, An De Keersgieter et al. "Stress simulations for optimal mobility group IV p- and nMOS FinFETs for the 14 nm node and beyond." in 2012 International Electron Devices Meeting, pp. 6-5. IEEE, 2012.

Johlin, Eric, Nouar Tabet, Sebastián Castro-Galnares, Amir Abdallah, Mariana I. Bertoni, Tesleem Asafa, Jeffrey C. Grossman, Syed Said, and Tonio Buonassisi. "Structural origins of intrinsic stress in amorphous silicon thin films." Physical Review B 85, No. 7 (2012): 075202.

Weber, O., T. Irisawa, T. Numata, M. Harada, N. Taoka, Y. Yamashita, T. Yamamoto, N. Sugiyama, M. Takenaka, and S. Takagi. "Examination of additive mobility enhancements for uniaxial stress combined with biaxially strained Si, biaxially strained SiGe and Ge channel MOSFETs." in 2007 IEEE International Electron Devices Meeting, pp. 719-722. IEEE, 2007.

* cited by examiner

METHOD FOR INDUCING STRESS IN SEMICONDUCTOR DEVICES

CROSS-REFERENCE TO RELATED APPLICATIONS

The present application is a non-provisional patent application claiming priority to European Patent Application No. EP 20181930.7, filed Jun. 24, 2020, the contents of which are hereby incorporated by reference.

FIELD OF THE DISCLOSURE

The present disclosure is related to semiconductor processing, in particular to the engineering of stress in semiconductor devices, for example in the channel area of nMOS and pMOS devices as produced in CMOS processing.

BACKGROUND

Stress relaxed buffer (SRB) layers are layers which create a biaxial stress in a semiconductor layer deposited on top of the SRB layer, thereby enhancing the carrier mobility in the channel of MOS transistors or diodes processed on the semiconductor layer. In this way, SRBs can significantly improve the performance of advanced CMOS technologies. Their main disadvantage is that the biaxial stress generated has opposite effects on nMOS and pMOS. A SRB/semiconductor combination may include a layer of SiGe as the SRB layer with a layer of silicon deposited on the SiGe. While uniform high tensile biaxial stress may be obtainable in a thin Si channel on top of a thick SiGe SRB layer, which is enhancing the nMOS drive current, this stress will also degrade the pMOS device performance. In particular, if the performance of the pMOS is enhanced by uniaxial compressive stress coming for example from SiGe junctions, the tensile biaxial stress counteracts this effect. Reference is made for example to the document "Examination of Additive Mobility Enhancements for Uniaxial Stress Combined with Biaxially Strained Si, Biaxially Strained SiGe and Ge Channel MOSFETs", Weber et al., 2007 IEEE International Electron Devices Meeting, Washington, D C, 2007, pp. 719-722.

SUMMARY

The disclosure aims to provide a solution to the above-described problem in the particular context of an SRB layer processed from the back side thereof. This aim is achieved by the method and by the integrated circuits in accordance with the appended claims.

According to some embodiments, two semiconductor devices comprising charge carriers of opposite polarity are produced on a semiconductor layer that is itself formed on the front surface of an SRB layer. The devices may include Metal-Oxide-Semiconductor (MOS) field effect devices, for example an nMOS transistor and a pMOS transistor produced in a CMOS process. According to some embodiments, the SRB layer is then processed from the back side thereof, for example by removing a substrate onto which the SRB is deposited. This backside processing includes the formation of a cavity in the SRB layer, underneath one of the two devices, and filling the cavity with a material that at least partially compensates the biaxial stress induced by the SRB layer in the semiconductor material of the channel area of the device. This may be used for controlling the mobility of the carriers of the device in question independently from the influence of the SRB layer on the other device. Example embodiments may be useful for compensating the effect the biaxial stress in a pMOS device while maintaining the effect in an adjacent nMOS device.

The disclosure is firstly related to a method for producing a first and second semiconductor device configured to conduct current through the controlled density of charge carriers in a channel area, wherein the charge carriers of the first device have opposite polarity to the charge carriers of the second device, the method comprising the steps of:

producing a stress relaxed buffer layer, hereafter abbreviated as SRB layer, the back side of the SRB layer being positioned on a substrate, producing a semiconductor layer on the front side of the SRB layer, producing the semiconductor devices on the semiconductor layer, wherein the SRB layer is configured to induce a biaxial stress in the channel areas of both devices. The production of the devices "on the semiconductor layer" includes additional processing of the semiconductor layer and/or the SRB layer before producing the actual devices, for example by forming fins comprising a base portion formed of the SRB material and a top portion formed of the semiconductor material.

Removing the substrate, and possibly thinning the SRB layer from its backside, producing a cavity in the SRB layer from the back side, located underneath the channel area of the second device, while no cavity is produced underneath the channel area of the first device. The term "underneath" refers to the location of the cavity when the IC is in the upward orientation. During the process, it is possible that the IC is oriented downward. The use of "underneath" does not mean that the method of example embodiments is limited to processing the IC in the upward position.

Filling the cavity with a material, thereby creating a stress compensation area, wherein the material filling the cavity is such that it at least partially compensates, i.e. counteracts, the biaxial stress in the channel area of the second device.

According to an embodiment, the method comprises further steps for producing buried power rails connected to the devices, and Through Semiconductor Vias, hereafter abbreviated as TSVs, which connect the buried power rails to the back side of the SRB layer.

According to an embodiment, at least one first TSV passes through the SRB layer for contacting a buried rail connected to the first device, and wherein at least one second TSV passes through the stress compensation area, for contacting a buried rail positioned within the channel area of the second device, and wherein the TSVs are produced by the steps of:

producing a first and second via by etching respectively from the back of the SRB layer and from the back of the stress compensation area, filling the vias with a conductive material.

According to an embodiment, the buried rail positioned within the channel area of the first device is provided with a dielectric liner, and wherein the stress compensation area is produced by depositing a stress compensation liner in the cavity followed by a bulk material, the etch process for producing the first and second via is configured so that the etch speed in the SRB layer is slower than the etch speed in the stress compensation area, the stress compensation liner deposited in the cavity is an etch stop layer for the etch process used for producing the vias, wherein the etch process for producing the vias is stopped when the stress compensation liner is reached at the bottom of the second via through the stress compensation area, thereafter, the first via through the SRB layer is continued by a timed etch, removing the stress compensation liner and the dielectric liner at the bottom of the first via through the SRB layer, filling the vias with an electrically conductive material.

According to an embodiment, the SRB layer is a SiGe layer and the semiconductor layer is a Si layer. In the latter case, the compensation area may be formed of amorphous silicon or SiN.

According to an embodiment, the SRB layer is a SiGe layer and the semiconductor layer is a Si layer and wherein the stress compensation liner is a layer of SiN and the bulk material is amorphous Si.

According to an embodiment, the first device is an nMOS device and the second device is a pMOS device.

The disclosure is equally related to an integrated circuit comprising a first and second semiconductor device configured to conduct current through the controlled density of charge carriers in a channel area formed in a semiconductor material, wherein the charge carriers of the first device have opposite polarity to the charge carriers of the second device, and wherein the devices are formed on the front surface of an SRB layer, the SRB layer being configured to induce a biaxial stress in the channel areas of both devices and wherein the SRB layer comprises a cavity underneath the channel area of the second device, while no cavity is present underneath the channel area of the first device, the cavity being open to the back surface of the SRB layer and being filled with one or more materials chosen such that they at least partially compensate the biaxial stress in the channel area of the second device, the filled cavity thereby forming a stress compensation area.

According to an embodiment of the IC, the devices are coupled to buried power rails, connected to the back side of the SRB layer by TSVs.

According to an embodiment of the IC, at least one first TSV passes through the SRB layer, and at least one second TSV passes through the stress compensation area, for contacting a buried rail positioned within the channel area of the second device.

According to an embodiment of the IC, the stress compensation area comprises a stress compensation liner along the surface of the cavity and a bulk material.

According to an embodiment of the IC, the SRB layer is a SiGe layer and the semiconductor material is Si. In the latter case, the compensation area may be formed of amorphous silicon or SiN.

According to an embodiment of the IC, the first device is an nMOS device and the second device is a pMOS device.

DETAILED DESCRIPTION

A number of embodiments will be described in detail, with reference to the figures. The use of specific materials and processes is cited merely by way of example and not as limitations to the scope of the disclosure.

Figure 1:
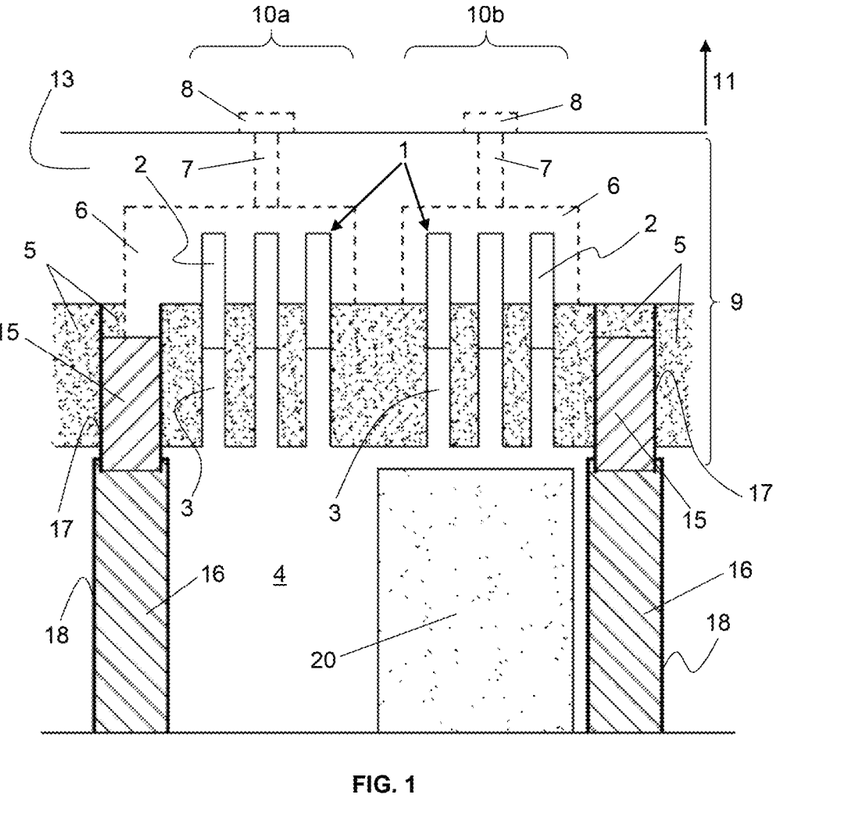
FIG. 1 illustrates an nMOS and pMOS transistor combination produced, according to example embodiments.

FIG. 1 illustrates a cross-section of a small portion of an integrated circuit chip (hereafter abbreviated as "IC") produced in accordance with example embodiments. The IC comprises two finFET transistors 10a and 10b, an nMOS transistor 10a and a pMOS transistor 10b, each comprising three parallel nano-sized fins 1 having a top portion 2 formed of doped silicon and a base portion 3 formed of SiGe. The base portions are uniform with underlying SiGe layer 4. The SiGe layer 4 together with the base portions 3 fulfills the role of a stress relaxed buffer layer with respect to the silicon top portions 2, by inducing a tensile biaxial stress in the Si of the top portions 2 of the fins 1. The thickness of the SiGe layer 4 may be about 500 nm. The fins may have dimensions such as a lateral thickness on the order of 3 to 10 nanometers and a height on the order of 100 nm (so the drawings are not necessarily drawn on a realistic scale but primarily meant to illustrate the concept of the disclosure). The channel areas of the transistors extend in the direction perpendicular to the drawing. The "channel area" is defined in the case of these finFET devices as the combined channels of the fins of each device. The fins are partly buried in a dielectric layer 5 (e.g., a silicon oxide layer), commonly referred to as the shallow trench isolation (STI) oxide.

Source and drain regions are not shown as they are located outside the plane of the drawing, placed on either side of the respective channel areas, and contacted by metal structures, known as local interconnects 6, represented in dotted lines, indicating that these structures also are not in the plane of the drawing. The local interconnects 6 are represented in a simplified way with respect to actual devices, in which the fins are provided with epitaxially grown contact areas contacted by the actual local interconnects. Such features may not be relevant to the present disclosure, hence the simplified representation.

Via connections 7 are shown, extending between the local interconnects 6 and a first level of metal conductors 8, and embedded in a pre-metal dielectric layer 13. The area indicated by numeral 9 and containing a large number of active devices is generally referred to as the front end of line (FEOL) area of the IC. Starting from the first level of interconnects 8, the IC then further comprises additional interconnect levels, not shown in the drawing, and known as the back end of line (BEOL) area 11.

The IC further comprises buried interconnect rails 15 extending in the direction perpendicular to the drawing. These are metal structures parallel to the fins 1, to which the local interconnects 6 are connected. The buried rails themselves are connected to the back of the IC by "through semiconductor via" connections (TSVs) 16. The buried rails 15 are isolated from the surrounding semiconductor material by dielectric liners 17 (e.g., formed of silicon oxide). In some cases such isolation liners may not be necessary, depending on the layout of the devices on the IC. The TSVs 16 are isolated by further dielectric liners 18. At the back of the SiGe layer 4, the TSVs 16 are connected to additional conductors (e.g., to a power delivery network) not shown in the drawings. The technology of the backside power delivery network connected to the FEOL through TSVs and buried power rails may be described for example in patent publication EP3324436.

The present disclosure is not limited to the context of the buried power rails 15, but finds an important field of application within this context. As such, example embodiments are also compatible with the presence of the buried power rails when these power rails are located between fins of the same device, i.e. within the channel area of the same device, as will be explained hereafter. However, the generally applicable context of example embodiments is defined by the presence of at least two devices such as transistors or diodes, of opposite polarity of the charge carriers, produced on a layer that has the characteristics of a biaxial tensile stress inducing layer with respect to the semiconductor material of the channel areas of the devices, and wherein the SRB layer is accessible from the back side during the fabrication process of the IC.

As will be apparent from the more detailed description of the method for producing the structure of FIG. 1, this context is indeed present for the SiGe of the base portion 3 of the fins 1 and of the bulk SiGe layer 4, with respect to the Si of the top portions 2 of the fins. As stated in the introduction, the SiGe acts as a stress relaxed buffer layer with respect to the Si. However, and as explained in the introduction, while the tensile biaxial stress is beneficial for the nMOS transistor 10a, the tensile stress has a negative impact on the pFET transistor 10b. Therefore, according to the disclosure, the SiGe layer 4 is locally thinned and replaced by another material in an area 20 lying underneath the channel area of the pFET 10b. The material is chosen so that it at least partially compensates the tensile biaxial stress induced in the pFET channel by the SRB layer 4. This is because the material in area 20 exhibits a built-in tensile stress, that locally impinges a compressive stress in the pMOS area. The material in area 20 may for example be SiN or amorphous silicon. The stress compensation area 20 is recognizable as a cavity in the SRB layer 4, that is open to the back side of this layer 4, and that is filled with the stress compensating material.

Figure 2A:
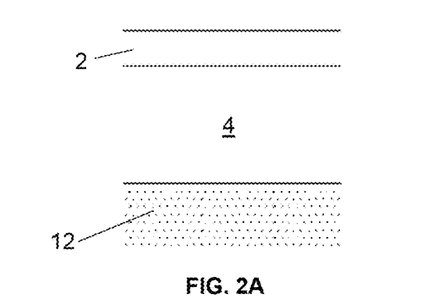
FIG. 2A shows a method step of a method for producing the transistor combination of FIG. 1, according to example embodiments.
Figure 2B:
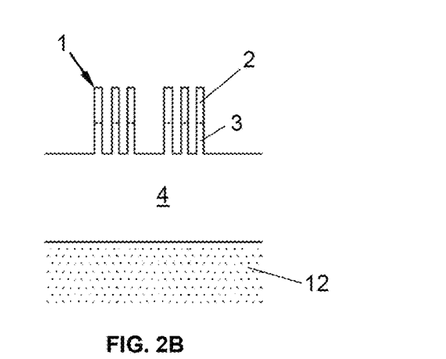
FIG. 2B shows a method step of a method for producing the transistor combination of FIG. 1, according to example embodiments.
Figures 2C, 2D:
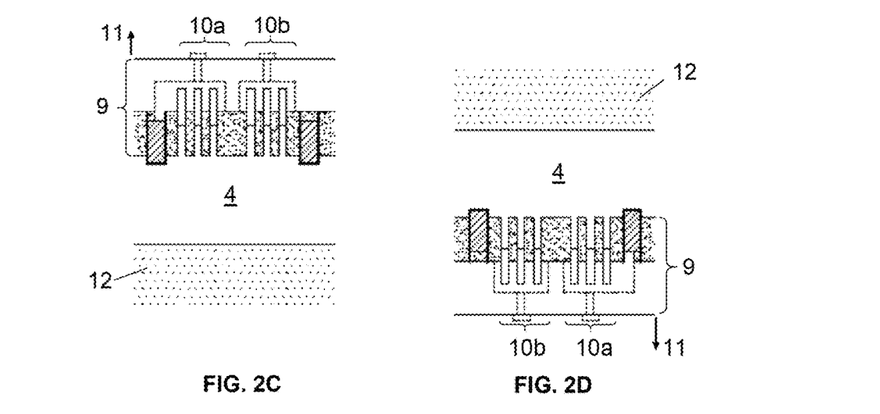
FIG. 2C shows a method step of a method for producing the transistor combination of FIG. 1, according to example embodiments.
FIG. 2D shows a method step of a method for producing the transistor combination of FIG. 1, according to example embodiments.
Figure 2E:
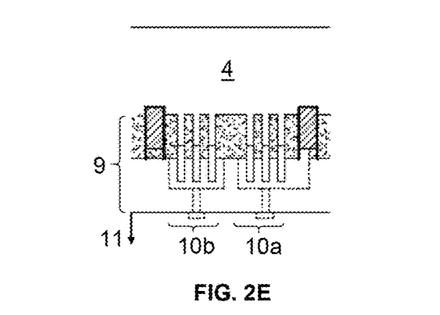
FIG. 2E shows a method step of a method for producing the transistor combination of FIG. 1, according to example embodiments.
Figure 2F:
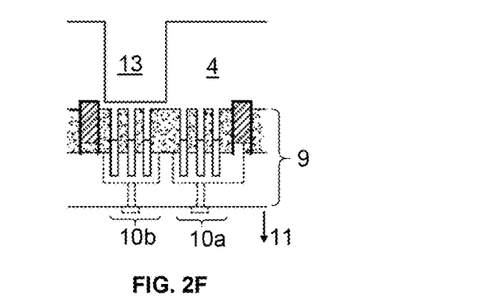
FIG. 2F shows a method step of a method for producing the transistor combination of FIG. 1, according to example embodiments.
Figures 2G, 2H:
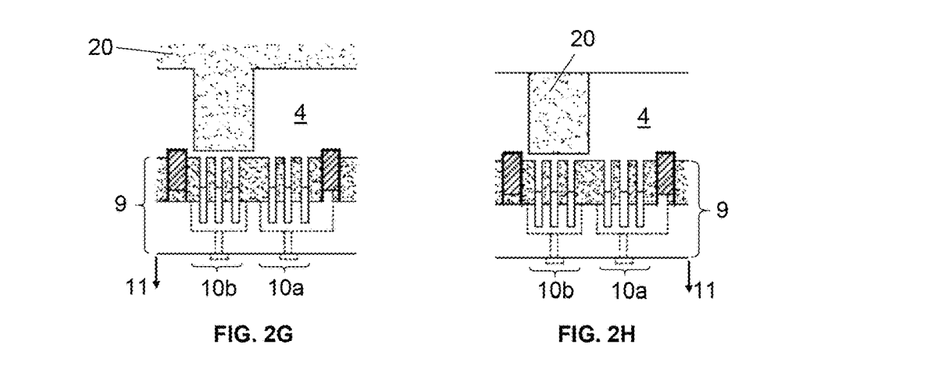
FIG. 2G shows a method step of a method for producing the transistor combination of FIG. 1, according to example embodiments.
FIG. 2H shows a method step of a method for producing the transistor combination of FIG. 1, according to example embodiments.

FIGS. 2A to 2H illustrate key steps in a method for producing the transistors shown in FIG. 1. FIG. 2A shows the initial layers of SiGe 4 and Si 2 deposited on a first substrate 12, which may be a silicon process wafer. The fins 1 are produced by lithography and etching, as illustrated in FIG. 2B. By a sequence of process steps not described here in detail, the FEOL and BEOL portions 9 and 11 are produced, see FIG. 2C. The first substrate 12 is then flipped and bonded to a second substrate (not shown), as illustrated in FIG. 2D. Then the first substrate 12 is removed (e.g., by a process which may include one or a combination of thinning methods, such as grinding, wet etching, non-selective dry etching and CMP (chemical mechanical polishing)). The SiGe layer 4 may act as an etch stop layer for a wet etching step at the end of the thinning process, so that the thinning stops when the SiGe layer 4 is reached. Alternatively, the thinning may remove a fraction of the SiGe layer, leaving however enough SiGe material to perform the role of stress relax buffer layer with respect to the Si fin portions 2. The result is illustrated in FIG. 2E. Then a cavity 13 is etched by lithography and etching, in the area above the pMOS transistor 10b, see FIG. 2F, while no cavity is formed above the nMOS transistor 10a. The cavity 13 may extend along the full length of the fins 1, or multiple cavities may be produced at specific portions of the fins, for example only in areas where pFETs are produced. The cavity 13 is subsequently filled with SiN or amorphous silicon, for example by plasma enhanced chemical vapour deposition PECVD (see FIG. 2G), and planarized (FIG. 2H). The parameters of the deposition process are configured so that the deposited material forms a tensile area, i.e. exhibits built-in tensile stress. Such parameters are not described here in detail. For example in the case of amorphous Silicon deposited by PECVD, adapting the pressure and the plasma-related parameters allows to tune the built-in stress, as described for example in document "Structural origins of intrinsic stress in amorphous silicon thin films" Eric Johlin et al., Physical review B 85, 2012. Similar adaptation of deposition parameters for obtaining stressed SiN instead of amorphous Si for filling the cavity 13 may be used. The fabrication sequence is thereafter continued with the formation of the TSVs 16 and backside contacts, possibly including a backside PDN as described in EP3324436.

Figure 3:
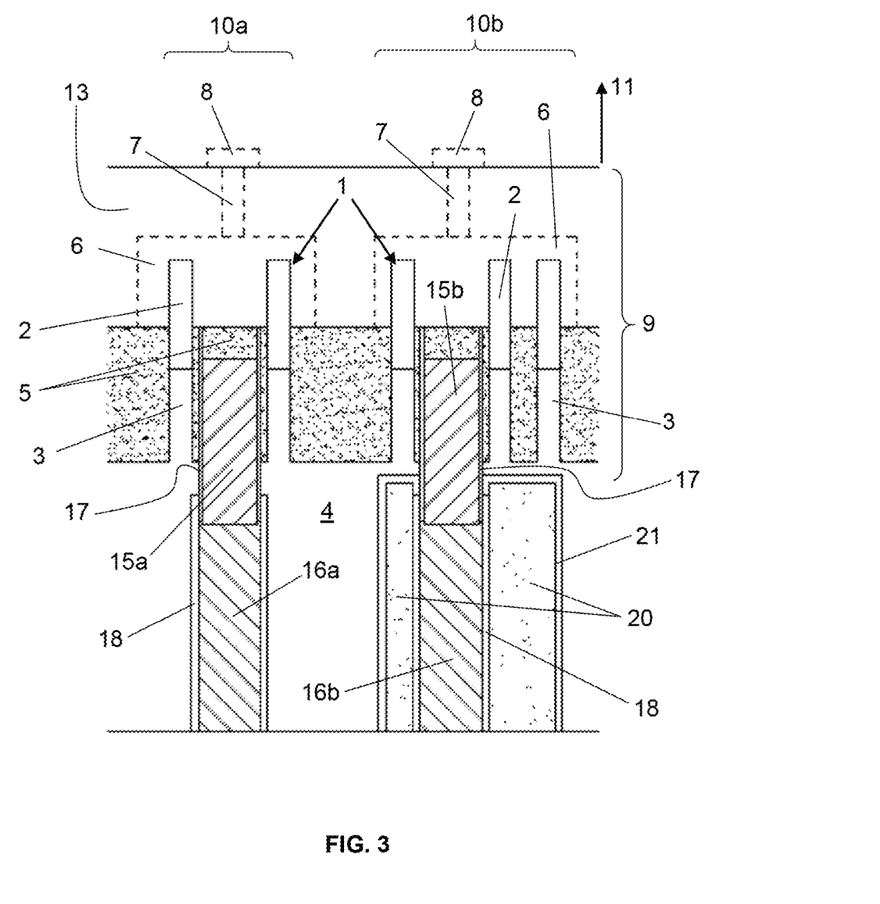
FIG. 3 illustrates an nMOS and pMOS transistor combination produced, according to example embodiments.

FIG. 3 shows an embodiment wherein two buried rails 15a and 15b are located in between the fins of the respective nMOS and pMOS transistors 10a and 10b. The first TSV 16a connects the back side of the SiGe layer 4 with the first rail 15a, as in the first embodiment. The second TSV 16b is now located in the stress compensation area 20 under the pMOS 10b, and contacts the buried rail 15b located amid the pMOS fins. The oxide liners 17 and 18 which isolate the buried rails 15a/15b and the TSVs 16a/16b from the surrounding materials are shown in more detail than in FIG. 1. The stress compensation area 20 now comprises a SiN liner 21, and a bulk area 22 of tensile amorphous Si. The reason for this structure is related to the method for producing the transistors of FIG. 3. Key steps of this method are illustrated in FIGS. 4A to 4L.

Figure 4A:
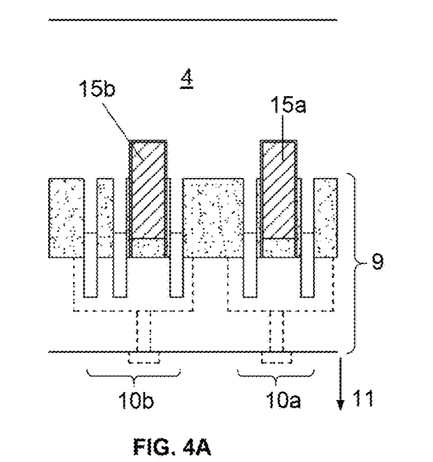
FIG. 4A shows a method step of a method for producing the transistor combination of FIG. 3, according to example embodiments.
Figure 4B:
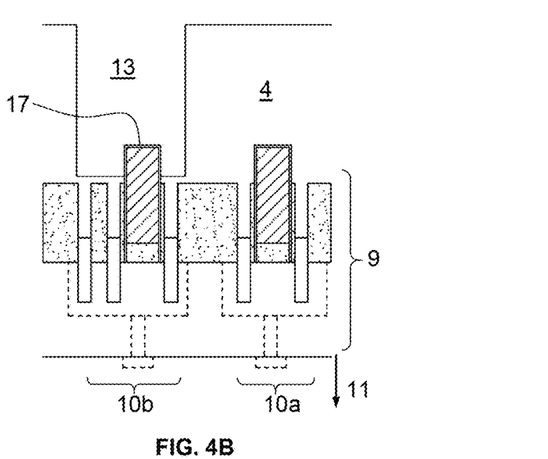
FIG. 4B shows a method step of a method for producing the transistor combination of FIG. 3, according to example embodiments.
Figure 4C:
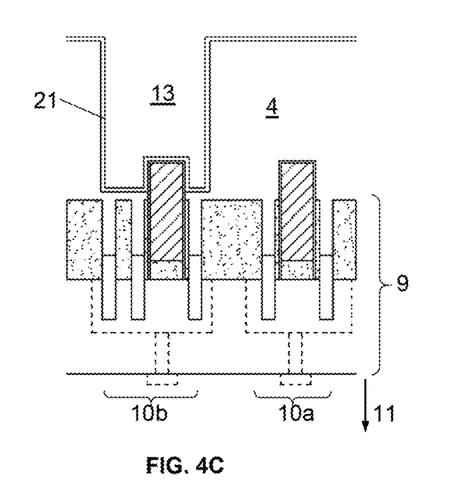
FIG. 4C shows a method step of a method for producing the transistor combination of FIG. 3, according to example embodiments.

The FEOL and BEOL portions 9 and 11 are processed again on a Si layer deposited on a SiGe buffer layer that is itself deposited on a first substrate, as described above in relation to FIGS. 2A to 2E. After flipping the first substrate, bonding it to a second substrate and removing the first substrate, the situation shown in FIG. 4A is obtained. Then the cavity 13 is etched selectively with respect to the oxide liner 17 of the buried rail 15b appearing at the bottom of the cavity 13 (FIG. 4B), and a SiN liner 21 is deposited conformally on the topography of the cavity (FIG. 4C). The SiN may be deposited for example by Plasma Enhanced Atomic Layer Deposition (PEALD) or PECVD. Within the broader scope of the disclosure (so not within the context of materials and processes stated in the detailed description), the liner 21 may or may not have in-built tensile stress. However, as the liner is present in the stress compensation area, this liner is referred to in the claims as the "stress compensation liner," to distinguish it from the liners 17 and 18. Built-in tensile stress may be obtained in the SiN liner 21 by increasing the pressure or the frequency of the plasma applied in PEALD or PECVD. A higher deposition temperature also leads to more tensile stress in the layer 21.

Figure 4D:
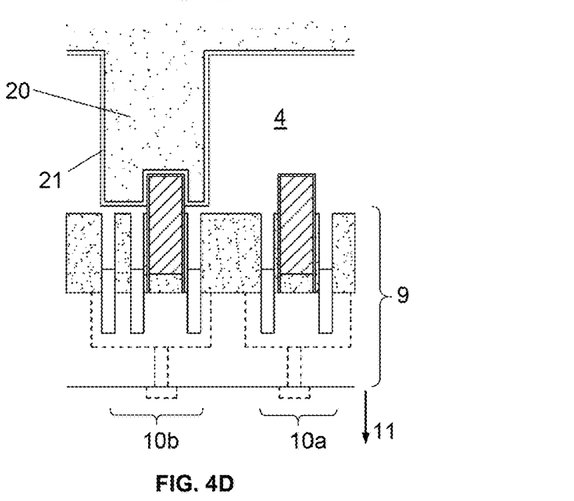
FIG. 4D shows a method step of a method for producing the transistor combination of FIG. 3, according to example embodiments.
Figure 4E:
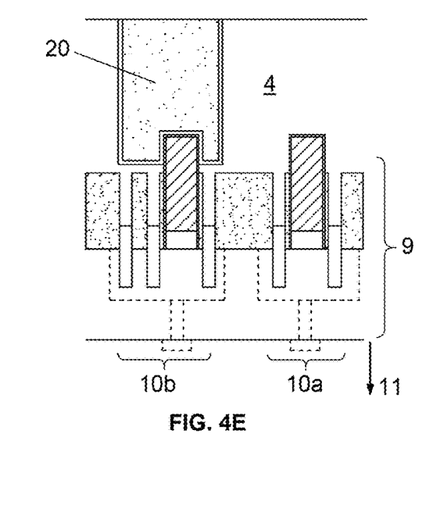
FIG. 4E shows a method step of a method for producing the transistor combination of FIG. 3, according to example embodiments.
Figure 4F:
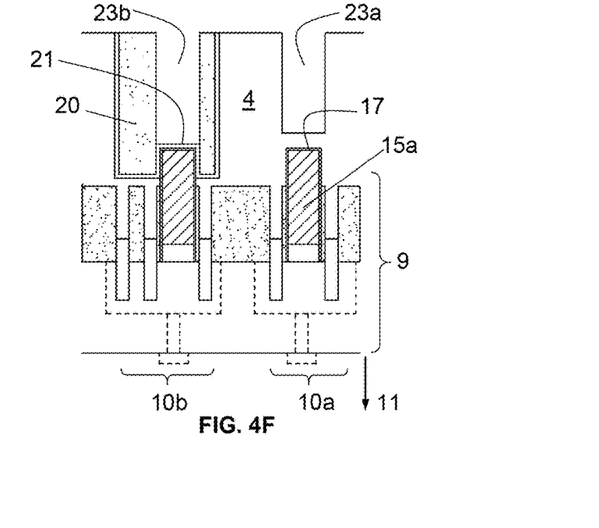
FIG. 4F shows a method step of a method for producing the transistor combination of FIG. 3, according to example embodiments.

Then a layer 22 of amorphous Si is deposited, for example by PECVD (FIG. 4D). PECVD parameters are applied which make the amorphous Si a tensile layer (see above). Then the back side of the wafer is planarized (FIG. 4E), resulting in the stress compensation area 20. Now the vias 23a and 23b are etched for producing the TSVs (FIG. 4F), using a plasma etch process that etches the amorphous Si faster than the SiGe. This may be done for example by adding $SF_6$ to a typical amorphous Si etch recipe. The faster etch reaches the SiN 21 in the region of the pMOS 10b faster than the oxide layer 17 in the region of the nMOS 10a, as illustrated in FIG. 4F, thereby avoiding exposure of the oxide 17 in the nMOS region to the etch process. This is the reason the SiN liner 21 may be used in this case. The SiN liner 21 furthermore acts as an etch stop layer.

Figure 4G:
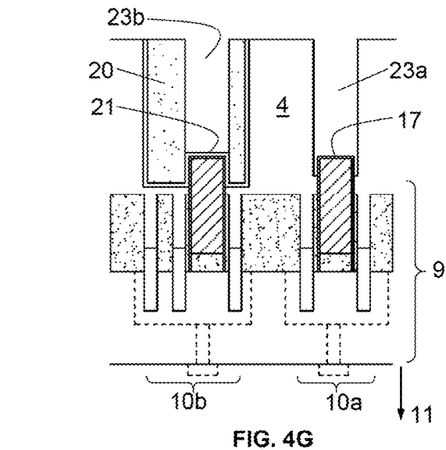
FIG. 4G shows a method step of a method for producing the transistor combination of FIG. 3, according to example embodiments.
Figure 4H:
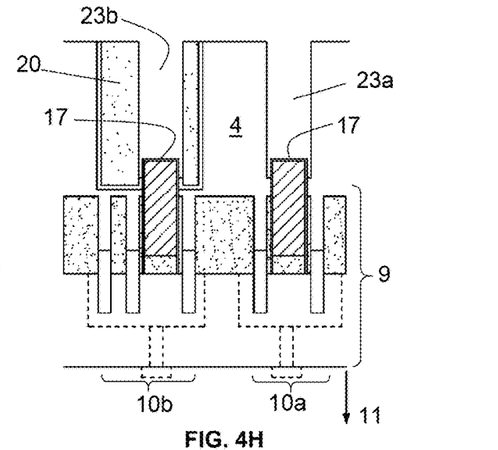
FIG. 4H shows a method step of a method for producing the transistor combination of FIG. 3, according to example embodiments.
Figure 4I:
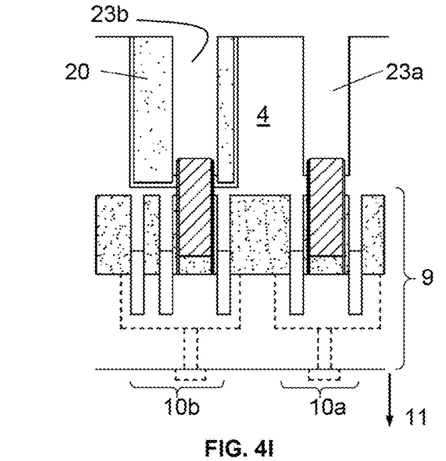
FIG. 4I shows a method step of a method for producing the transistor combination of FIG. 3, according to example embodiments.
Figure 4J:
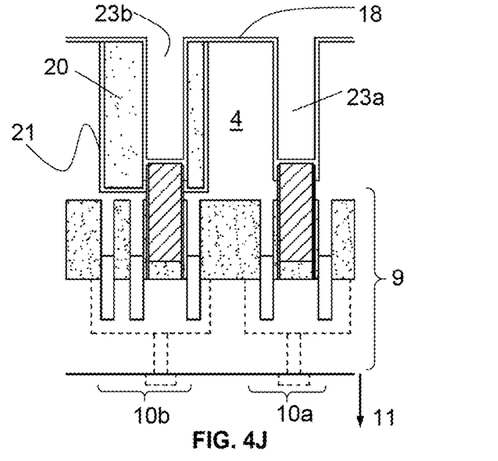
FIG. 4J shows a method step of a method for producing the transistor combination of FIG. 3, according to example embodiments.
Figure 4K:
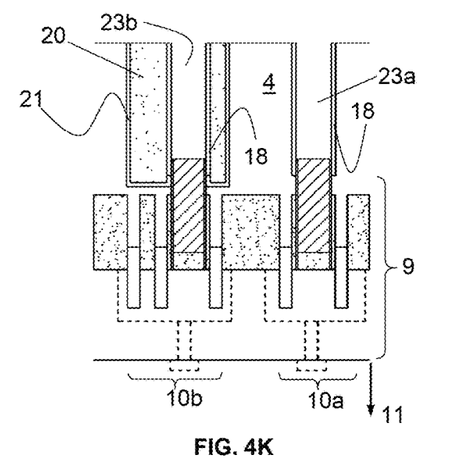
FIG. 4K shows a method step of a method for producing the transistor combination of FIG. 3, according to example embodiments.
Figure 4L:
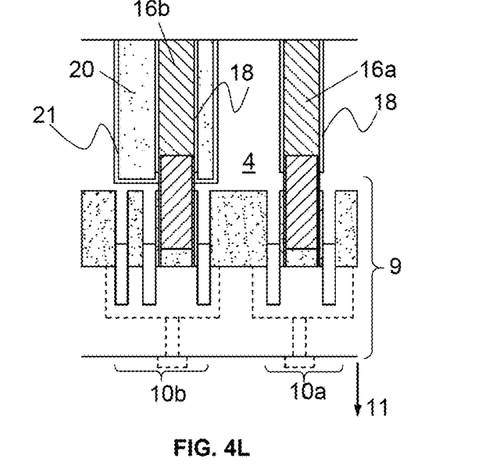
FIG. 4L shows a method step of a method for producing the transistor combination of FIG. 3, according to example embodiments.

After the SiN liner 21 has been exposed at the bottom of via 23b by the faster etch in the pMOS region, the rest of the SiGe in the nMOS region is removed by a timed etch, resulting in the situation shown in FIG. 4G. Then the SiN 21 is removed selectively with respect to the oxide liner 17 in via 23b (FIG. 4H), followed by etching back the oxide liner 17 itself in the two vias 23a and 23b (FIG. 4I). Then a further oxide liner 18 is conformally deposited in the vias (FIG. 4J), and removed only at the bottom of the vias (FIG. 4K), by a plasma etch as described for example in patent publication EP3035369, according to which a protective polymer is deposited on the sidewalls of the vias, so that the oxide 18 is maintained on the sidewalls while the oxide is removed from the bottom of the vias. The polymer may afterwards be removed by a treatment in an oxygen-based plasma. Finally, as seen in FIG. 4L, the vias are filled with a conductive material, for example copper, and the back surface is planarized, resulting in the final TSVs 16a and 16b, which may be followed by the formation of contacts and possibly a power delivery network on the back side of the IC.

The method and the IC of example embodiments in their most generalized definition are not limited by many of the details described above but only by the features stated in the enclosed independent claims. Other materials may be used, for example Ge in stead of Si for the top portions 2 of the fins 1, the Ge being combined with GeSn in stead of SiGe for the SRB layer 4. Silicon oxide could replace the SiN of the stress compensation liner 21 in the embodiment of FIG. 3. The disclosure is not limited to finFET transistors or diodes but can be applied to any type of device configured to conduct current through the controlled density of charge carriers in a channel area, including planar transistors or diodes. The biaxial stress that is compensated may be a tensile biaxial stress, as in the example described above. The reverse case is also possible, i.e. a compressive biaxial stress is compensated by a compensation area 20 with built-in compressive stress.

While example embodiments have been illustrated and described in detail in the drawings and foregoing description, such illustration and description are to be considered illustrative and not restrictive. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A method for producing a first semiconductor device and a second semiconductor device configured to conduct current through a controlled density of charge carriers in a channel area formed in a semiconductor material, wherein the charge carriers of the first semiconductor device have opposite polarity to the charge carriers of the second semiconductor device, the method comprising the steps of:
producing a stress relaxed buffer (SRB) layer, wherein the back side of the SRB layer is positioned on a substrate;
producing a semiconductor layer on the front side of the SRB layer;
producing the first semiconductor device and the second semiconductor device on the semiconductor layer, wherein the SRB layer is configured to induce a biaxial stress in the channel areas of both devices;
removing the substrate and thinning the SRB layer from its backside;
producing a cavity in the SRB layer from the back side, located underneath the channel area of the second semiconductor device, while no cavity is produced underneath the channel area of the first semiconductor device; and
filling the cavity with one or more materials, thereby creating a stress compensation area, wherein the one or more materials filling the cavity at least partially compensate the biaxial stress in the channel area of the second semiconductor device, and wherein:
the first semiconductor device and the second semiconductor device are coupled to buried power rails, connected to the back side of the SRB layer by through semiconductor vias (TSVs); or
the SRB layer is a SiGe layer, the semiconductor material is Si, and the compensation area is formed of amorphous silicon or SiN.

2. The method according to claim 1, wherein the first semiconductor device and the second semiconductor device are coupled to the buried power rails through the TSVs, which connect the buried power rails to the back side of the SRB layer.

3. The method according to claim 2, wherein at least one first TSV passes through the SRB layer for contacting a buried rail connected to the first semiconductor device, wherein at least one second TSV passes through the stress compensation area in order to contact a buried rail positioned within the channel area of the second semiconductor device, and wherein the TSVs are produced by the steps of:
producing a first via and second via by etching respectively from the back of the SRB layer and from the back of the stress compensation area; and
filling the vias with a conductive material.

4. The method according to claim 3,
wherein the buried rail positioned within the channel area of the first semiconductor device is provided with a dielectric liner,
wherein the stress compensation area is produced by depositing a stress compensation liner in the cavity followed by a bulk material,
wherein the etch process for producing the first via and second via is configured so that the etch speed in the SRB layer is slower than the etch speed in the stress compensation area,
wherein the stress compensation liner deposited in the cavity is an etch stop layer for the etch process used for producing the vias,
wherein the etch process for producing the vias is stopped when the stress compensation liner is reached at the bottom of the second via through the stress compensation area,
wherein, after stopping the etch process for producing the vias when the stress compensation liner is reached at the bottom of the second via through the stress compensation area, the first via through the SRB layer is continued by a timed etch, which removes the stress compensation liner and the dielectric liner at the bottom of the first via through the SRB layer, and
wherein the method further comprises filling the vias with an electrically conductive material.

5. The method according to claim 1, wherein the SRB layer is the SiGe layer and the semiconductor layer is Si.

6. The method according to claim 5, wherein the compensation area is formed of amorphous silicon or SiN.

7. The method according to claim 4, wherein the stress compensation liner is a layer of SiN and the bulk material is amorphous Si.

8. The method according to claim 1, wherein the first semiconductor device is an nMOS device and the second semiconductor device is a pMOS device.

9. An integrated circuit (IC) comprising a first semiconductor device and a second semiconductor device configured to conduct current through a controlled density of charge carriers in a channel area formed in a semiconductor material,
wherein the charge carriers of the first semiconductor device have opposite polarity to the charge carriers of the second semiconductor device,
wherein the first semiconductor device and the second semiconductor device are formed on the front surface of a stress relaxed buffer (SRB) layer,
wherein the SRB is being configured to induce a biaxial stress in the channel areas of both the first semiconductor device and the second semiconductor device,
wherein the SRB layer comprises a cavity underneath the channel area of the second semiconductor device, while no cavity is present underneath the channel area of the first semiconductor device,
wherein the cavity is open to the back surface of the SRB layer and is filled with one or more materials chosen such that they at least partially compensate the biaxial stress in the channel area of the second semiconductor device, the filled cavity thereby forming a stress compensation area, and
wherein:
the first semiconductor device and the second semiconductor device are coupled to buried power rails, connected to the back side of the SRB layer by through semiconductor vias (TSVs); or
the SRB layer is a SiGe layer, the semiconductor material is Si, and the compensation area is formed of amorphous silicon or SiN.

10. The IC according to claim 9, wherein the first semiconductor device and the second semiconductor device are coupled to the buried power rails, connected to the back side of the SRB layer by the TSVs.

11. The IC according to claim 10, wherein at least one first TSV passes through the SRB layer and at least one second TSV passes through the stress compensation area in order to contact a buried rail positioned within the channel area of the second semiconductor device.

12. The IC according to claim 11, wherein the stress compensation area comprises a stress compensation liner along the surface of the cavity and a bulk material.

13. The IC according to claim 9, wherein the SRB layer is the SiGe layer and the semiconductor material is Si.

14. The IC according to claim 13, wherein the compensation area is formed of amorphous silicon or SiN.

15. The IC according to claim 9, wherein the first semiconductor device is an nMOS device and the second semiconductor device is a pMOS device.

16. An integrated circuit (IC) comprising a first semiconductor device and a second semiconductor device configured to conduct current through a controlled density of charge carriers in a channel area formed in a semiconductor material, wherein the charge carriers of the first semiconductor device have opposite polarity to the charge carriers of the second semiconductor device, and wherein the IC is formed by a method comprising:
producing a stress relaxed buffer (SRB) layer, wherein the back side of the SRB layer is positioned on a substrate;
producing a semiconductor layer on the front side of the SRB layer;
producing the first semiconductor device and the second semiconductor device on the semiconductor layer, wherein the SRB layer is configured to induce a biaxial stress in the channel areas of both devices;
removing the substrate and thinning the SRB layer from its backside;

producing a cavity in the SRB layer from the back side, located underneath the channel area of the second semiconductor device, while no cavity is produced underneath the channel area of the first semiconductor device; and filling the cavity with one or more materials, thereby creating a stress compensation area, wherein the one or more materials filling the cavity at least partially compensate the biaxial stress in the channel area of the second semiconductor device; and wherein:
the first semiconductor device and the second semiconductor device are coupled to buried power rails, connected to the back side of the SRB layer by through semiconductor vias (TSVs); or the SRB layer is a SiGe layer, the semiconductor material is Si, and the compensation area is formed of amorphous silicon or SiN.

17. The IC according to claim 16, wherein the first semiconductor device and the second semiconductor device are coupled to the buried power rails through the TSVs, which connect the buried power rails to the back side of the SRB layer.

18. The IC according to claim 17, wherein at least one first TSV passes through the SRB layer for contacting a buried rail connected to the first semiconductor device, wherein at least one second TSV passes through the stress compensation area in order to contact a buried rail positioned within the channel area of the second semiconductor device, and wherein the TSVs are produced by the steps of:

producing a first and second via by etching respectively from the back of the SRB layer and from the back of the stress compensation area; and filling the vias with a conductive material.

19. The IC according to claim 18, wherein the buried rail positioned within the channel area of the first semiconductor device is provided with a dielectric liner, wherein the stress compensation area is produced by depositing a stress compensation liner in the cavity followed by a bulk material, wherein the etch process for producing the first via and second via is configured so that the etch speed in the SRB layer is slower than the etch speed in the stress compensation area, wherein the stress compensation liner deposited in the cavity is an etch stop layer for the etch process used for producing the vias, wherein the etch process for producing the vias is stopped when the stress compensation liner is reached at the bottom of the second via through the stress compensation area, wherein, after stopping the etch process for producing the vias when the stress compensation liner is reached at the bottom of the second via through the stress compensation area, the first via through the SRB layer is continued by a timed etch, which removes the stress compensation liner and the dielectric liner at the bottom of the first via through the SRB layer, and wherein the method further comprises filling the vias with an electrically conductive material.

20. The IC according to claim 16, wherein the SRB layer is the SiGe layer and the semiconductor layer is Si.

* * * * *